(12) United States Patent
Zhang et al.

(10) Patent No.: US 8,586,650 B2
(45) Date of Patent: Nov. 19, 2013

(54) THERMALLY CONDUCTIVE COMPOSITION

(75) Inventors: Yimin Zhang, Ballwin, MO (US); Allison Y. Xiao, Belle Mead, NJ (US)

(73) Assignee: Henkel US IP LLC, Rocky Hill, CT (US)

( * ) Notice: Subject to any disclaimer, the term of this patent is extended or adjusted under 35 U.S.C. 154(b) by 445 days.

(21) Appl. No.: 12/722,832

(22) Filed: Mar. 12, 2010

(65) Prior Publication Data

US 2010/0208429 A1    Aug. 19, 2010

Related U.S. Application Data

(63) Continuation of application No. PCT/US2007/020018, filed on Sep. 14, 2007.

(51) Int. Cl.
  *C08K 9/00*    (2006.01)
(52) U.S. Cl.
  USPC .......................................... 523/205; 523/210
(58) Field of Classification Search
  USPC .................................. 523/205, 210
  See application file for complete search history.

(56) References Cited

U.S. PATENT DOCUMENTS

| | | |
|---|---|---|
| 5,717,054 A | 2/1998 | Schultz |
| 6,160,042 A | 12/2000 | Ishida |
| 6,300,456 B1 | 10/2001 | Musa |
| 6,307,001 B1 | 10/2001 | Musa |
| 6,432,320 B1 | 8/2002 | Bonsignore et al. |
| 6,441,121 B1 | 8/2002 | Musa et al. |
| 6,713,088 B2 | 3/2004 | Lodyga et al. |
| 6,849,338 B2 | 2/2005 | Clemens et al. |
| 6,946,513 B2 * | 9/2005 | Higashino et al. ............ 524/544 |
| 2005/0035230 A1 | 2/2005 | Kanbara et al. |
| 2005/0228093 A1 | 10/2005 | Yamazaki et al. |
| 2006/0121068 A1 | 6/2006 | Sane et al. |
| 2006/0228542 A1 | 10/2006 | Czubarow |

FOREIGN PATENT DOCUMENTS

| | | |
|---|---|---|
| EP | 1286394 A | 2/2003 |
| EP | 1114843 B1 | 3/2006 |
| JP | 2002-030223 A | 1/2002 |
| WO | 2006019751 A1 | 2/2006 |

* cited by examiner

*Primary Examiner* — Edward Cain
(74) *Attorney, Agent, or Firm* — Steven C. Bauman

(57) ABSTRACT

A composition for use as a thermally conductive composition in a heat-generating electronic device is provided. The composition comprises physically treated fillers modified with a surface area modifying agent and one or more resins.

16 Claims, 3 Drawing Sheets

Figure 1. Raman Spectroscopy
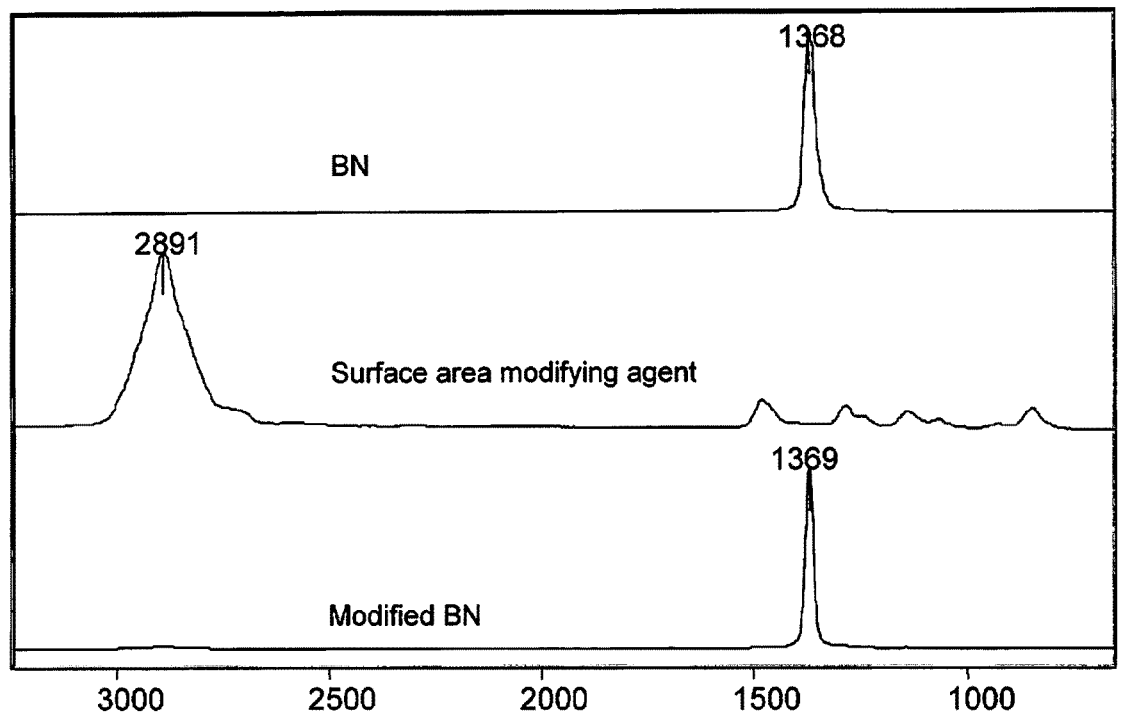
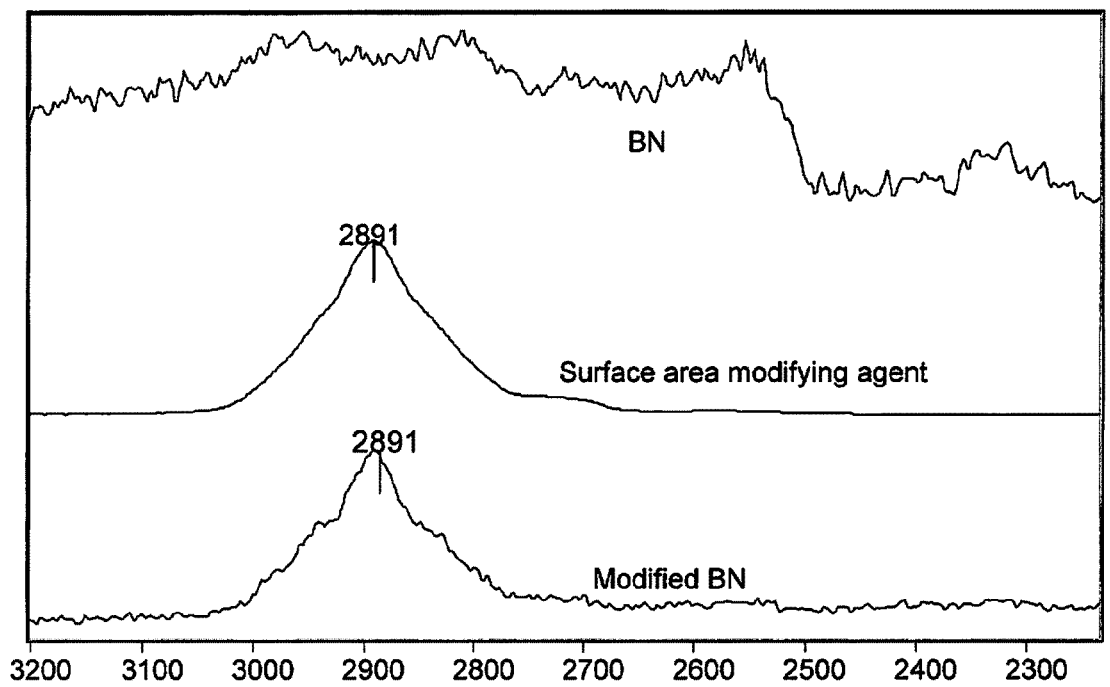

Figure 2. Scanning Electronic Microscopy
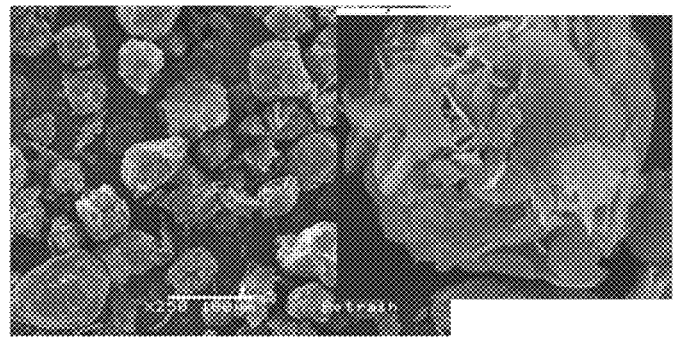
Sample Filler A - BET 3.95 m$^2$/g
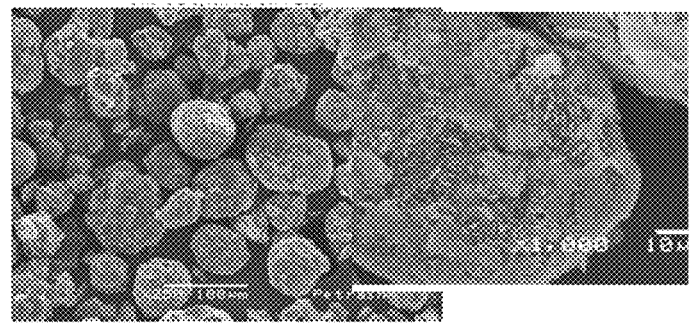
Sample Filler E - BET 1.79 m$^2$/g Figure 3. Viscosity vs. Filler percent Loading
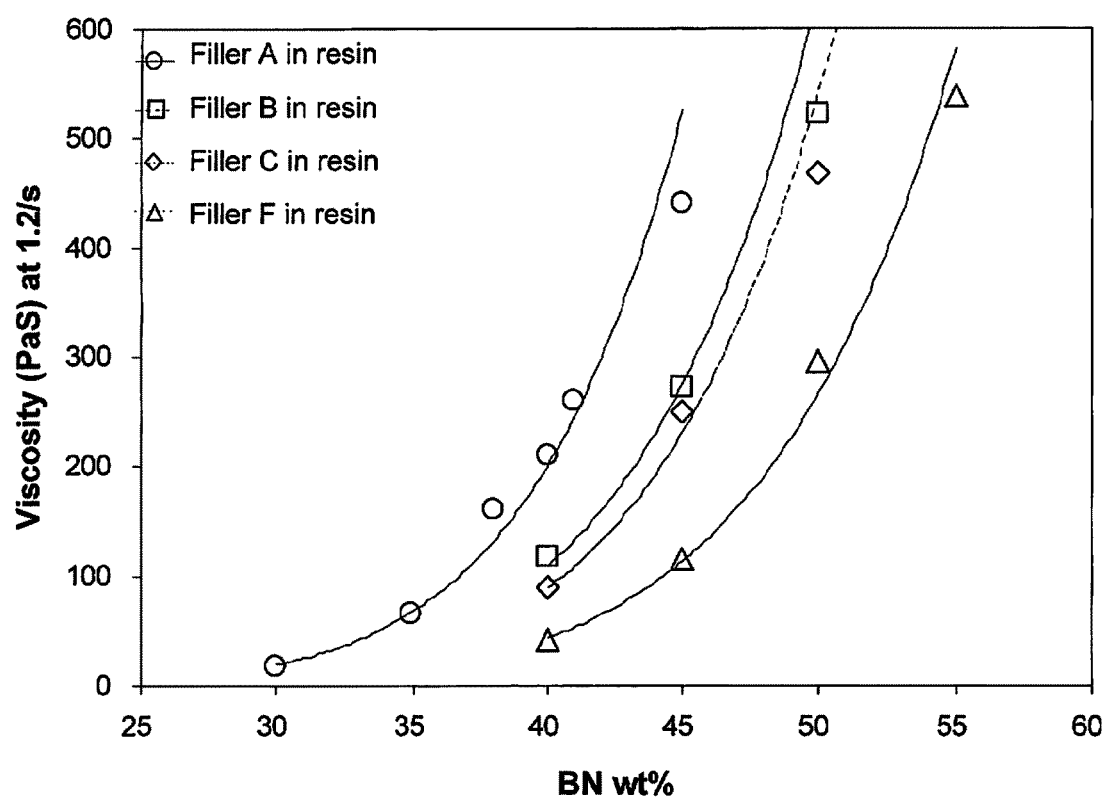

THERMALLY CONDUCTIVE COMPOSITION

CROSS-REFERENCE TO RELATED APPLICATIONS

This application is a continuation of International Application No. PCT/US2007/020018 filed Sep. 14, 2007, the contents of which is incorporated herein by reference.

FIELD OF THE INVENTION

This invention relates to a thermally conductive composition that is utilized to transfer heat from a heat-generating electronic device to a cold sink, which absorbs and dissipates the transferred heat.

BACKGROUND OF THE INVENTION

Electronic devices, such as those containing semiconductors, typically generate a significant amount of heat during operation. To cool the semiconductors, a thermally conductive composition is used to provide an intimate contact between the semiconductor and a cold sink to facilitate the heat transfer out of the semiconductor and to the cold sink. Thermally conductive compositions are used to improve the heat flux between hot devices/substrates and cold sinks/spreaders. Thermally conductive compositions may consist of thermally conductive fillers and a resin binder. As the concentration of thermally conductive fillers increase, the thermal conductivity of the system improves. However, increasing filler loading can sacrifice performance characteristics (e.g. adhesion, flexibility) or application requirements (e.g. paste viscosity, handling characteristics of film compositions).

Thermally conductive compositions with a low viscosity and good flowability are desirable for the more powerful and denser semiconductor chips currently being designed. Low viscosity thermally conductive compositions are desirable for fragile chips and for the solder bonds that attach the chips to a substrate, because of the minimal force necessary to apply the composition to the semiconductor chip and the resulting decrease in the risk of compromising the integrity of the chip.

There continues to be a need in the art for a thermally conductive composition with good thermal conductivity and good flowability. The present invention addresses this need.

SUMMARY OF THE INVENTION

It has now been discovered that physical treatment of the fillers with a surface area modifying agent by coating the outer layer and filling the internal pores of the fillers improves the thermal conductivity of compositions containing these treated fillers compared to those compositions that contain fillers that are not so treated with the surface area modifying agent. The compositions prepared with physically treated fillers are particularly useful in packaging products such as electronic devices and electronic components. The fillers suitable for use in the present invention may be mixtures of fillers, and/or composite fillers, capable of providing the desired properties of thermal conductivity, electrical conductivity, thermal insulation, electrical insulation, sound insulation, light absorption, light reflectivity, or combinations of such properties.

This invention is directed to a composition that comprises a filler, which is physically treated with a surface area modifying agent and a resin binder.

In another embodiment, the surface area modifying agent has a melting point between about 25° C. and about 150° C.

In a further embodiment, the surface area modifying agent has a melting point between about 30° C. to about 80° C.

In yet another embodiment, the surface area modifying agent is a polyalkene oxide, natural wax, synthetic wax or mixtures thereof.

In still another embodiment, the physical treatment of fillers is conducted by coating the outer layers of the fillers and/or filling the internal pores of the fillers with a surface area modifying agent. Exemplary surface area modifying agents are ethylene oxide-propylene oxide (EO-PO) copolymers terminated with —OH functional groups, ethylene oxide-propylene oxide-ethylene oxide (EO-PO-EO) copolymers terminated with —OH functional groups, propylene oxide-ethylene oxide-propylene oxide (PO-EO-PO) copolymers terminated with —OH functional groups, polyethylene glycols, polyethylene oxide, polypropylene oxide, wax, and copolymers and blends.

Another embodiment of the composition is directed to a physically treated agglomerate of boron nitride.

In a further embodiment of the composition, the agglomerate of boron nitride is physically treated with a polyethylene oxide homopolymer or copolymer.

In another embodiment, the composition further optionally comprises one or more of the following: curing agent, curing accelerator, catalyst, adhesion promoter, reactive diluent, non-reactive diluent, surfactant, wetting agent, antioxidant, thixotrope, reinforcement composition, silane, titanate, wax, phenol formaldehyde, silane functional perfluoroether, phosphate functional perfluoroether, air release agent, flow additive, adhesion promoter, rheology modifier, defoamer and spacer bead.

In another embodiment, this invention is a method for physically treating filler comprising dissolving a surface area modifying agent in a solvent, dispersing the untreated fillers in the solvent-surface area modifying agent solution, evaporating the solvent, and drying the fillers that has now been physically treated with a surface area modifying agent.

In a further embodiment, the method for physically treating filler comprises dissolving a surface area modifying agent in water, placing the untreated fillers and the water-surface area modifying agent solution in a fluid bed coater to physically treat the filler with a surface area modifying agent.

Yet another embodiment provides articles manufactured using the thermally conductive composition of the invention.

Another aspect of the present invention provides an electronic device containing a heat-generating component, a cold sink and a thermally conductive composition.

Still another aspect is directed to a process of sealing and/or making or forming an intimate contact between a semiconductor and a cold sink. These processes comprise applying the thermally conductive composition of the invention onto a substrate and curing/drying the thermally conductive composition to form a pad, grease, phase change composition, film, paste, adhesives and the like. Application can be, for example, by dispensing, stencil, screen rotogravure or flexo printing.

BRIEF DESCRIPTION OF THE DRAWINGS

FIG. 1 is a Raman Spectroscopy of boron nitride, surface area modifying agent (Pluronic F38) and surface area modified boron nitride.

FIG. 2 is the Scanning Electronic Microscopy figures of BN size and agglomeration before and after the physical treatment.

FIG. 3 shows the relationship of viscosity vs. filler loading of BN and surface area modified BN.

DETAILED DESCRIPTION OF THE PREFERRED EMBODIMENTS

It has been discovered that control of the morphology of the fillers, of the internal voids/pores of the fillers, and of the compatibility of the filler surface and the resin, can control the viscosity and the overall thermal conductivity of the composition.

The filler of the invention comprises porous filler with rough surfaces. Physical treatment of the filler introduces the surface area modifying agent into the pores of the filler and onto the surface of the filler, thereby decreasing the overall surface area of the filler. Compositions comprising the resultant physically treated filler exhibit lower viscosity than compositions comprising the same loading of non-physically treated filler. Additionally, the compositions comprising the physically treated fillers have improved thermal conductivity as compared to compositions comprising fillers that are not so physically treated.

It is understood in the art that physical treatment is different than chemical treatment. Unlike chemical treatment, physical treatment does not create or break new chemical bonds.

The thermally conductive compositions of this invention comprise physically treated thermally conductive fillers. These fillers may either be electrically conductive or non-conductive. Typically, fillers preferred for physical treatment are those that have a rough surface and/or a porous structure. The untreated fillers may comprise any suitable thermally conductive material, including boron nitride, aluminum nitride, copper, silver, aluminum, magnesium, brass, gold, nickel, alumina, zinc oxide, magnesium oxides, iron oxide, silver oxide, copper oxide, metal-coated organic particles, silver plated nickel, silver plated copper, silver plated aluminum, silver plated glass, silver flake, silver powder, carbon black, graphite, diamond, carbon nanotube, silica and mixtures thereof. Preferably, the untreated fillers are boron nitride. More preferably the untreated fillers are agglomerated boron nitride, available under the trade name PTX60 from Momentive Performance Inc., Ohio or PCTL7 MHF from Saint Gobain Ceramics, New York.

The surface area modifying agent is used to control the morphology of the filler shape and/or fill the internal voids/pores of the fillers. The introduction of surface area modifying agent decreases the overall surface area of the filler.

The surface area modifying agent is a solid at room temperature and has a melting temperature below curing temperature of the resin. The melting point of the surface area modifying agent is from about 25° C. to about 150° C. In another embodiment, the melting point of the surface area modifying agent is from about 30° C. to 80° C. The low melting point enables filler-filler contacts at elevated temperatures for improved thermal conductivity. The solid-to-liquid phase change at the melting temperature of the surface area modifying agent can absorb the heat generated from the device while temporarily maintaining low interfacial temperature.

The surface area modifying agent for the filler may include a polyalkene oxide, natural wax, synthetic wax or mixtures thereof. Non-limiting examples of polyalkene oxide include polyethylene oxide homopolymers and copolymers. Non-limiting examples of natural wax include plant waxes such as candelilla wax, carnauba wax, rice wax, haze wax and jojoba oil; animal waxes such as beeswax, lanolin and spermaceti; mineral waxes such as montan wax, ozokerite and ceresin; and petroleum waxes such as paraffin wax, microcrystalline wax and petrolactam. Non-limiting examples of synthetic wax include synthetic hydrocarbons such as Fischer-Tropsch wax and polyethylene wax; denatured waxes such as montan wax derivatives, paraffin wax derivatives and microcrystalline wax derivatives; hydrogenated waxes such as hydrogenated castor oil and hydrogenated castor oil derivatives; fatty acids, acid amides, esters, ketones, and other waxes such as 12-hydroxystearic acid, stearic acid amide, anhydrous phthalic imide and chlorinated hydrocarbon.

Preferred surface area modifying agents are ethylene oxide-propylene oxide (EO-PO) copolymers with —OH functional groups, EO-PO-EO copolymers with —OH functional groups, PO-EO-PO copolymers with —OH functional groups, polyethylene glycols, polyethylene oxide, polypropylene oxide, wax, and mixtures thereof.

The surface area modifying agent is included in the composition in amount of from about 0.1% to about 30% by the total weight of the filler. More preferably, the surface area modifying agent is in a range from about 0.5% to about 20% by the total weight of the filler.

In a further embodiment, the surface area modifying agent is soluble in a solvent. Exemplary solvents are water miscible and volatile. Non-limiting solvents include water, low molecular weight alcohols, such as ethanol, methanol, n-propanol, isopropanol; and low molecular weight ketones, such as acetone and MEK. However, the surface area modifying agent is not soluble in the resin binder.

There are several methods to physically treat the fillers. One non-limiting example is to dissolve the surface area modifying agent in a solvent, disperse the fillers in the solution of surface area modifying agent-solvent, evaporate the solvent and dry the physically treated fillers. In another non-limiting example, the physical treatment of fillers can be effected by dissolving the surface area modifying agent in water, followed by placing the fillers and the solution of surface area modifying agent-solvent in a fluid bed coater. It should be understood that other conventional methods may be used to physically treat the fillers.

The physically treated filler mean size is from about 0.01 microns to about 1000 microns. In another embodiment, the physically treated filler mean size is from about 1 to about 300 microns. In a further embodiment, the physically treated filler mean size is from about 10 to about 200 microns.

The fillers may be discrete in size, multimodal, or have a broad size distribution.

The physically treated fillers comprise in the range of about 10% to about 40% by volume of the total composition, preferably in the range of about 15 to about 35% by volume.

The resin binder of the thermally conductive composition may be selected from any resins currently used throughout the industry. In general, the resin binder is selected from the group consisting of epoxies, silicones, epoxide terminated silicones, maleimides, bismaleimides, vinyl ethers, vinyl esters, itaconates, fumarates, polyimides, cyanate esters, fluorosilicones, polyurethanes, acrylate monomers and polymers, fatty esters, maleates, isocyanates, polyolefines, norbornenes, episulfides, benzoxanzines, styrenics, oxazolines, amines, phenolics, allyl compounds polyesters and mixtures thereof.

In one embodiment, the resin is selected from the group consisting of flexible epoxy, silicones, epoxide terminated silicones and bismaleimides. Flexible epoxy may be synthesized according to U.S. Pat. No. 5,717,054. Silicone is commercially available from Nusil, under the trade name of PLY7500. Epoxide terminated silicones is commercially available from Hans Chemie, under the trade name of Albiflex. Bismaleimides may be synthesized according to U.S. Pat. No. 6,300,456, 6,307,001 or 6,441,121.

The resin may be cured with any of the known curing agents including, for example, imidazoles, peroxides and amines, free radical initiator and metal catalysts. Non-limiting examples of curing agents include blocked imidazoles, 2-ethyl-4-methylimidazole, 2-methylimidazole, 2-phenylimidazole, 2-phenyl-4-methylimidazole, 2-undecylimidazole, 1-benzyl-2-methylimidazole, 1-cyanoethyl-2-methylimidazole, 1-cyanoethyl-2-ethyl-4-methylimidazole, dicyanediamine, or mixtures thereof.

It should be understood that a wide range of cure conditions are possible, that is, the time, temperature and pressure applied during cure, and these can be determined by the practitioner for the chosen resin without undue experimentation.

Various additives that may be included are diluents (reactive and non-reacting), antioxidants, plasticizers, stabilizers, dispersing agents, coloring agents, tackifiers, adhesives, corrosion inhibitors, catalysts, adhesion promoters, surface active agents, wetting agents, thixotropes, reinforcement compositions, silanes, titanates, wax, phenol formaldehyde, silane functional perfluoroether, phosphate functional perfluoroether, air release agents, flow additives, adhesion promoters, rheology modifiers, defoamers, spacer beads and mixtures thereof.

The use of physically treated fillers increases the overall thermal conductivity of the composition. The use of the physically treated fillers can increase the thermal conductivity of the composition by at least about 5%, up to above 50% when compared to compositions with non-physically treated fillers at a similar viscosity.

The thermally conductive composition of the present invention may be utilized with virtually any heat-generating component for which it is desired to dissipate the heat. In particular, the thermally conductive composition is useful for aiding in the dissipation of heat from heat-generating components in semiconductor devices. In such devices, the thermally conductive composition forms a layer between the heat-generating component and the cold sink and transfers the heat to be dissipated to the cold sink. The thermally conductive composition may also be used in a device containing a heat spreader. In such a device, a layer of thermally conductive composition may be placed between the heat-generating component and the heat spreader and a second layer, which is usually thicker than the first layer, may be placed between the heat spreader and the cold sink.

The thermally conductive composition may be formed into a pad, grease, phase change compositions, film, paste, adhesives, and the like. The thermally conductive composition may be employed in any consumer product with a heat-generating device and heat-dissipating device. Applications include microprocessor packaging, bearing housings, heat-exchanger applications such as heat sinks for microprocessors and integrated circuit chips, plastic ball grid array packages, quad flat packs, and other common surface-mounted integrated circuit packages, and the like, particularly applications demanding a high thermal conductivity. Encompassed are computers and computer equipment, e.g., printers, fax machines, scanners and the like, and household appliances, and personal electronic devices, such as cameras, CD-players, DVD-players, cassette tape recorders and the like. Such articles typically comprise electronic components which have been adhered by such electrically conductive composition The invention is further illustrated by the following non-limiting examples:

EXAMPLES

Example 1

Physical Treatment of Filler with Surface Area Modifying Agent

Two different methods of physically treating fillers with a surface area modifying agent have been described.

Example 1A

Solution Method

Nine grams of Pluronic F38 (EO-PO block copolymers with —OH terminations, Mw=4700 g/mol, available from BASF) was dissolved into 200 mL of water. Into the Pluronic F38-water solution, 91 g of boron nitride fillers (PTX60, available from Momentive Performance Inc., OH) were dispersed. The water was then evaporated with constant stirring and vacuum overnight. The resultant dry powder weighed 100 g.

Example 1B

Fluidization Method

Nine grams of Pluronic F38 (EO-PO block copolymers with —OH terminations, Mw=4700 g/mol, available from BASF) was dissolved into 45 mL of water. The Pluronic F38-water solution and 91 g of boron nitride fillers (PTX60) were placed in a fluid bed coater (Model MFL.01 by Vector Corporation, IA) to physically treat the fillers. The resultant dry powder weighed 100 g.

Example 2

Removal of Surface Area Modifying Agent

Five grams of the physically treated BN using Example 1A method was dispersed in 100 g of water, stirred overnight and then centrifuged. The supernate was transferred to an empty container and dried in air. The dried supernate was collected as 0.79 g. This indicated that more than 90% of the surface modifier can be recovered by one wash. Infrared spectroscopy (Nicolet Magna-IR 560 Spectrometer) confirmed that the dried supernate was Pluronic F38. The reversibility of the process indicated that there was no chemical reaction between the BN powder and the surface area modifying agent.

Example 3

Raman Spectroscopy

Raman spectroscopy (Nicolet Almega XR by Thermal Fisher Scientific, MA) of untreated BN, surface modifier (Pluronic F38) and physically treated BN with Pluronic F38 are shown in FIG. 1. As shown in FIG. 1, the characteristic peak of BN at 2891 cm-1 did not shift after the physical treatment the filler with Pluronic F38, indicating that Pluronic F38 did not chemically react with BN.

Example 4

Surface Area Changes

Various amounts of surface area modifying agents were used to treat BN (PTX60) to result in different surface areas, listed in Table 1. The surface area of the unmodified and modified BN agglomerates was measured with Brunauer, Emmett and Teller (BET) method (Micromeritics TriStar 3000 Automated Physisorption Analyzer by Micromeritics, GA). As shown in Table 1, there is a direct correlation between the amount of agent and the resultant surface area. FIG. 2 (Scanning Electronic Microscopy JSM-6380LV by JEOL USA, MA) showed that the filler size and agglomeration remained the same before and after the modification, indicating the decrease of surface area is attributed to filling the pores and/or smoothing out the rough exterior of the filler.

TABLE 1

Surface Area of Fillers

| Sample | Surface area modifying agent | % Surface area modifying agent | Method of Physical Treatment | SA ($m^2/g$) |
|---|---|---|---|---|
| A | none | 0 | None | 3.95 |
| B | Pluronics F38[a] | 6 | Fluidization | 2.06 |
| C | Pluronics F38[a] | 9 | Solution | 1.95 |
| D | Pluronics F68[b] | 9 | Fluidization | 1.73 |
| E | Pluronics F38[a] | 9 | Solution | 1.79 |
| F | Pluronics F38[a] | 17 | Solution | 1.14 |
| G | Pluronics F68[b] | 17 | Solution | 1.17 |
| H | PEG[c] | 17 | Solution | 1.49 |
| I | PEO[d] | 17 | Solution | 1.35 |

[a]EO-PO copolymer, 4700 g/mol, mp 48° C. available from BASF, NJ
[b]EO-PO copolymer, 8400 g/mol, mp 52° C. available from BASF, NJ
[c]Polyethylene glycol, 4,600 g/mol, mp 62° C. available from Sigma Aldrich.
[d]Polyethylene oxide, 50,000 g/mol, mp 65° C. available from Sigma Aldrich.

As shown in Table 1, the surface area of boron nitride treated fillers was reduced after the physical modification.

Another BN agglomerate, PCTL7 MHF (available from Saint Gobain), was physically treated to reduce the surface area. The BET surface area values of untreated and 9% Pluronics F38 treated PCTL7 MHF were 2.99 and 1.58 $m^2/g$, respectively.

Example 5

Viscosity vs. Filler Weight Percent Loading

FIG. 3 shows a graph of Viscosity vs. Filler Weight Percent Loading. Flexible epoxy, synthesized according to U.S. Pat. No. 5,717,054 and fillers (A, B, C and F, separately) were combined using a high speed mixer (FlackTek, model DAC150FVZ-K). The viscosity was measured with a strain controlled ARES rheometer (TA Instrument, model ARES-4×727802) at 25° C., with shear rate of 1.2/s.

As shown in FIG. 3, as the surface area of the filler decreases, the viscosity decreased when compared to the same filler loading of higher surface area fillers.

Example 6

Thermal Conductivity

Table 2 lists the components and the thermal conductivity for various formulations at a specific viscosity. Formulations were made to achieve viscosities of 100 PaS, 200 PaS and 300 PaS at 1.2/s shear rate using various fillers. Formulations were then crosslinked (at 150° C. in conventional oven for 60 minutes) and the thermal conductivity values were measured with photo flash instrument by Netzsch (Burlington, Mass.).

TABLE 2

Thermal Conductivity at a given Viscosity

| Formulation | 1 | 2 | 3 | 4 |
|---|---|---|---|---|
| Resin | Epoxy[a] | Epoxy[a] | Epoxy[a] | Epoxy[a] |
| Curing agent | Imidazole[b] | Imidazole[b] | Imidazole[b] | Imidazole[b] |
| Filler | A | C | D | F |
| thermal conductivity at viscosity of 100 PaS (W/m° K) | 1.3 | 1.6 | 1.7 | 1.7 |
| thermal conductivity at viscosity of 200 PaS (W/m° K) | 1.4 | 2.1 | 2.0 | 2.4 |
| thermal conductivity at viscosity of 300 PaS (W/m° K) | 1.7 | 2.8 | 2.8 | 2.8 |

[a]Flexible Epoxy synthesized according to U.S. Pat. No. 5,717,054
[b]2-ethyl-4-methyl-imidazole, available from Aldridch For a given viscosity, the thermal conductivity was higher for those formulations containing fillers with lower surface area. The standard deviation of the thermal conductivity values are ±0.1 W/m° K.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

We claim:

1. A thermally conductive composition comprising
   a filler, physically treated with a surface area modifying agent selected from the group consisting of polyalkene oxide, natural wax, synthetic wax or mixtures thereof
   and a resin binder selected from the group consisting of epoxies, silicones, epoxide terminated silicones and bis-maleimides.

2. The thermally conductive composition of claim 1, wherein the filler is characterized as having an outer surface and/or internal pores which are treated with said surface area modifying agent.

3. The thermally conductive composition of claim 1, wherein the surface area modifying agent has a melting point of about 25° C. to about 150° C.

4. The thermally conductive composition of claim 1, wherein the surface area modifying agent is selected from the group consisting of ethylene oxide-propylene oxide copolymers with —OH functional groups, ethylene oxide-propylene oxide-ethylene oxide copolymers with —OH functional groups, propylene oxide-ethylene oxide-propylene oxide copolymers with —OH functional groups, polyethylene glycols, polyethylene oxide, polypropylene oxide, wax, and mixtures thereof.

5. The thermally conductive composition of claim 1, wherein the filler is selected from the group consisting of boron nitride, aluminum nitride, copper, silver, aluminum, magnesium, brass, gold, nickel, alumina, zinc oxide, magnesium oxides, iron oxide, silver oxide, copper oxide, metal-coated organic particles, silver plated nickel, silver plated copper, silver plated aluminum, silver plated glass, silver flake, silver powder, carbon black, graphite, diamond, carbon nanotube, silica and mixtures thereof.

6. The thermally conductive composition of claim 5, wherein the filler is boron nitride.

7. The thermally conductive composition of claim 6, wherein the boron nitride is agglomerated or porous.

8. The thermally conductive composition of claim 7, wherein the filler has a size range from about 0.01 to about 1,000 micron.

9. The thermally conductive composition of claim 1, wherein the resin binder is selected from the group consisting of epoxies, silicones, epoxide terminated silicones, maleimides, bismaleimides, vinyl ethers, vinyl esters, itaconates, fumarates, polyimides, cyanate esters, fluorosilicones, polyurethaness, acrylate monomers and polymers, fatty esters, maleates, isocyanates, polyolefines, norbornenes, episulfides, benzoxanzines, styrenics, oxazolines, amines, phenolics, allyl compounds polyesters and mixtures thereof.

10. The thermally conductive composition of claim 1, wherein the composition further comprises a curing agent, curing accelerator, catalyst, adhesion promoter, reactive diluent, non-reactive diluent, surfactant, wetting agent, antioxidant, thixotrope, reinforcement composition, silane, titanate, wax, phenol formaldehyde, silane functional perfluoroether, phosphate functional perfluoroether, air release agent, flow additive, adhesion promoter, rheology modifier, defoamer, spacer bead or mixtures thereof.

11. The thermally conductive composition of claim 1, wherein the composition is cured/dried to a pad, grease, phase change composition, film, paste or adhesive.

12. A thermally conductive composition comprising physically treated porous boron nitride with ethylene oxide/propylene oxide block copolymer, an epoxy resin and an imidazole crosslinking agent.

13. A process for making or forming an electronic device with the thermally conductive composition of claim 1 comprising: applying the thermally conductive composition by dispensing, stencil, screen rotogravure or flexo printing onto a substrate and curing and/or drying said composition.

14. An electronic device comprising the thermally conductive composition of claim 1.

15. An electronic device comprising a heat-generating component, a cold sink and the thermally conductive composition of claim 1.

16. A method of preparing a physically treated filler comprising: dispersing untreated fillers in a solvent and a surface area modifying agent; evaporating said solvent; and drying to form said physically treated filler.

* * * * *